United States Patent
Zhao

(10) Patent No.: US 10,360,869 B2
(45) Date of Patent: Jul. 23, 2019

(54) LIQUID CRYSTAL PANEL DRIVING CIRCUIT AND LIQUID CRYSTAL DISPLAY DEVICE

(71) Applicant: WUHAN CHINA STAR OPTOELECTRONICS TECHNOLOGY CO., LTD., Wuhan, Hubei (CN)

(72) Inventor: Mang Zhao, Hubei (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 0 days.

(21) Appl. No.: 15/564,121

(22) PCT Filed: May 3, 2017

(86) PCT No.: PCT/CN2017/082808
§ 371 (c)(1),
(2) Date: Oct. 3, 2017

(87) PCT Pub. No.: WO2018/176561
PCT Pub. Date: Oct. 4, 2018

(65) Prior Publication Data
US 2018/0277053 A1    Sep. 27, 2018

(30) Foreign Application Priority Data
Mar. 27, 2017  (CN) .......................... 2017 1 0187713

(51) Int. Cl.
G09G 3/36      (2006.01)
G02F 1/1368    (2006.01)
G02F 1/1362    (2006.01)
H01L 27/12     (2006.01)

(52) U.S. Cl.
CPC .......... *G09G 3/3688* (2013.01); *G02F 1/1368* (2013.01); *G02F 1/136286* (2013.01); *H01L 27/124* (2013.01); *G09G 2310/0297* (2013.01)

(58) Field of Classification Search
CPC ...... G11C 7/1051; G11C 7/00; G09G 3/3688; G09G 2310/0297; G02F 1/136286; G02F 1/1368; H01L 27/124
See application file for complete search history.

(56) References Cited

U.S. PATENT DOCUMENTS

2005/0041488 A1* 2/2005 Ito ..................... G11C 5/063
                                                    365/199
2006/0227628 A1* 10/2006 Eriguchi .............. G09G 3/20
                                                    365/189.07

* cited by examiner

*Primary Examiner* — Gerald Johnson
(74) *Attorney, Agent, or Firm* — Ladas & Parry LLP

(57) ABSTRACT

A liquid crystal panel driving circuit and a liquid crystal display device are provided. Every three sub-pixel unit columns are defined as a row cycle that comprises a first data line, a second data line, and a third data line coupled to a same data driving signal output line of the data driver via the switch unit. The switch unit is configured to control the first data line, the second data line, and the third data line to output data signals in different output orders.

13 Claims, 4 Drawing Sheets

LIQUID CRYSTAL PANEL DRIVING CIRCUIT AND LIQUID CRYSTAL DISPLAY DEVICE

BACKGROUND

Field

The present disclosure relates to a technical field of a liquid crystal display, and more particularly to a liquid crystal panel driving circuit and a liquid crystal display device.

Background

A conventional liquid crystal display device generally includes an array of pixels, where each pixel typically includes sub-pixel units with three colors of red, green and blue. Each of the sub-pixel units is controlled by a gate line and a data line, where the gate line controls on and off statuses of the sub-pixel units, and the data line drives the sub-pixel units to display different gray levels by applying different data signals to achieve a full-color image display.

With the development of display technologies, people increasingly expect higher and higher qualities of display brightness, color reproduction, picture color richness. Only using three primary colors of red, green and blue in a display device cannot meet requirements of the display device. Thus, a four-color display device of red, green, blue and white is provided, where a white sub-pixel unit is added to each of the pixels to form an RGBW pixel structure having a red sub-pixel unit R, a green sub-pixel unit G, a blue sub-pixel unit B, and a white sub-pixel unit W. In a new pixel arrangement mode, the color expression consistency and the light transmittance of the liquid crystal display device are improved. The power consumption is lower while displaying the same picture brightness, and in the same power consumption, the brightness is greatly improved, such that picture levels are become clear and the pictures are more permeable.

However, a conventional driving circuit of liquid crystal display device defines every three rows of sub-pixel units as a row cycle, where the row cycle includes a first data line, a second data line, and a third data line that are driven by a data driving signal of a same data driving signal output line in a data driver. In each frame picture, data output orders of the first data line, second data line, and third data line are the same so that many vertical lines shows on the liquid crystal display device, thereby downgrading the display quality of the liquid crystal display device.

Consequently, there is a need to provide a liquid crystal panel driving circuit and a liquid crystal display device to solve the above-mentioned problems in related arts.

SUMMARY OF THE DISCLOSURE

Therefore, one objective of the present disclosure is to provide a liquid crystal panel driving circuit and a liquid crystal display device to improve the vertical lines on the liquid crystal display device and upgrade the display quality of the liquid crystal display device.

Based on the above objective, the present disclosure sets forth the following technical solutions. The present disclosure provides a liquid crystal panel driving circuit, comprising an array substrate arranged by a plurality of sub-pixel units, a data driver, a switch unit, and a plurality of data lines and scan lines formed between a plurality of sub-pixel unit columns and sub-pixel unit rows; wherein each of the sub-pixel unit columns is coupled to one scan line, each of the sub-pixel unit rows is coupled to one data line, every three sub-pixel unit columns are defined as a row cycle that comprises a first data line, a second data line, and a third data line coupled to a same data driving signal output line of the data driver via the switch unit; wherein the switch unit is configured to control the first data line, the second data line, and the third data line to output data signals in different output orders; wherein the switch unit comprises a first control switch, a second control switch and a third control switch; wherein first terminals of the first control switch, the second control switch and the third control switch are coupled to the same data driving signal output line of the data driver; wherein a second terminal of the first control switch is coupled to the first data line, a second terminal of the second control switch is coupled to the second data line, and a second terminal of the third control switch is coupled to the third data line; wherein a control terminal of the first control switch is configured to receive a first control signal, a control terminal of the second control switch is configured to receive a second control signal, and a control terminal of the third control switch is configured to receive a third control signal; wherein the output orders of the data signals which are output by the first data line, the second data line, and the third data line comprises: the data signals are sequentially output by a first output order of the first data line, the second data line and the third data line; the data signals are sequentially output by a second output order of the third data line, the first data line and the second data line; and the data signals are sequentially output by a third output order of the second data line, the third data line and the first data line.

In at least one embodiment, the first control switch, the second control switch and the third control switch are a thin film transistor, and the first terminal, the second terminal and the control terminal of the first control switch, the second control switch and the third control switch are a source electrode, a drain electrode and a gate electrode.

In at least one embodiment, the output orders of the data signals output by the first data line, the second data line and the third data line are switched once at a time period, wherein the data signals are output according to the first output order during a (3n+1)th time period, the data signals are output according to the second output order during a (3n+2)th time period, the data signals are output according to the third output order during a (3n+3)th time period, and wherein n is an integer greater than zero.

The present disclosure provides a liquid crystal panel driving circuit, comprising an array substrate arranged by a plurality of sub-pixel units, a data driver, a switch unit, and a plurality of data lines and scan lines formed between a plurality of sub-pixel unit columns and sub-pixel unit rows; wherein each of the sub-pixel unit columns is coupled to one scan line, each of the sub-pixel unit rows is coupled to one data line, every three sub-pixel unit columns are defined as a row cycle that comprises a first data line, a second data line, and a third data line coupled to a same data driving signal output line of the data driver via the switch unit; wherein the switch unit is configured to control the first data line, the second data line, and the third data line to output data signals in different output orders.

In at least one embodiment, the switch unit comprises a first control switch, a second control switch and a third control switch; wherein first terminals of the first control switch, the second control switch and the third control switch are coupled to the same data driving signal output line of the data driver; wherein a second terminal of the first control switch is coupled to the first data line, a second terminal of the second control switch is coupled to the second data line, and a second terminal of the third control switch is coupled to the third data line; and wherein a control terminal of the first control switch is configured to receive a first control signal, a control terminal of the second control switch is configured to receive a second control signal, and a control terminal of the third control switch is configured to receive a third control signal.

In at least one embodiment, the first control switch, the second control switch and the third control switch are a thin film transistor, and the first terminal, the second terminal and the control terminal of the first control switch, the second control switch and the third control switch are a source electrode, a drain electrode and a gate electrode.

In at least one embodiment, the output orders of the data signals which are output by the first data line, the second data line, and the third data line comprises: the data signals are sequentially output by a first output order of the first data line, the second data line and the third data line; the data signals are sequentially output by a second output order of the third data line, the first data line and the second data line; and the data signals are sequentially output by a third output order of the second data line, the third data line and the first data line.

In at least one embodiment, the output orders of the data signals output by the first data line, the second data line and the third data line are switched once at a preset time period, wherein the data signals are output according to the first output order during a (3n+1)th time period, the data signals are output according to the second output order during a (3n+2)th time period, the data signals are output according to the third output order during a (3n+3)th time period, and wherein n is an integer greater than zero.

The present disclosure provides a liquid crystal display device comprising a liquid crystal panel driving circuit, wherein the liquid crystal panel driving circuit comprises an array substrate arranged by a plurality of sub-pixel units, a data driver, a switch unit, and a plurality of data lines and scan lines formed between a plurality of sub-pixel unit columns and sub-pixel unit rows; wherein each of the sub-pixel unit columns is coupled to one scan line, each of the sub-pixel unit rows is coupled to one data line, every three sub-pixel unit columns are defined as a row cycle that comprises a first data line, a second data line, and a third data line coupled to a same data driving signal output line of the data driver via the switch unit; wherein the switch unit is configured to control the first data line, the second data line, and the third data line to output data signals in different output orders.

In at least one embodiment, the switch unit comprises a first control switch, a second control switch and a third control switch; wherein first terminals of the first control switch, the second control switch and the third control switch are coupled to the same data driving signal output line of the data driver; wherein a second terminal of the first control switch is coupled to the first data line, a second terminal of the second control switch is coupled to the second data line, and a second terminal of the third control switch is coupled to the third data line; and wherein a control terminal of the first control switch is configured to receive a first control signal, a control terminal of the second control switch is configured to receive a second control signal, and a control terminal of the third control switch is configured to receive a third control signal.

In at least one embodiment, the first control switch, the second control switch and the third control switch are a thin film transistor, and the first terminal, the second terminal and the control terminal of the first control switch, the second control switch and the third control switch are a source electrode, a drain electrode and a gate electrode.

In at least one embodiment, the output orders of the data signals which are output by the first data line, the second data line, and the third data line comprises: the data signals are sequentially output by a first output order of the first data line, the second data line and the third data line; the data signals are sequentially output by a second output order of the third data line, the first data line and the second data line; and the data signals are sequentially output by a third output order of the second data line, the third data line and the first data line.

In at least one embodiment, the output orders of the data signals output by the first data line, the second data line and the third data line are switched once at a preset time period, wherein the data signals are output according to the first output order during a (3n+1)th time period, the data signals are output according to the second output order during a (3n+2)th time period, the data signals are output according to the third output order during a (3n+3)th time period, and wherein n is an integer greater than zero.

The present disclosure provides a liquid crystal panel driving circuit and a liquid crystal display device by changing the output orders of the data signals of the first data line, the second data line, and the third data line, such that the superposition of the data signals of the first data line, the second data line, and the third data line using a plurality of time periods to improve the vertical lines on the liquid crystal display device and upgrade the display quality of the liquid crystal display device.

BRIEF DESCRIPTION OF THE DRAWINGS

To describe the technical solutions of the present application more clearly, the accompanying drawings for illustrating at least one embodiment will be introduced briefly in the following. Apparently, the accompanying drawings in the following description are only some embodiments of the present application, and a person of ordinary skill in the art may obtain other drawings based on these accompanying drawings without creative efforts.

DETAILED DESCRIPTION OF THE PREFERRED EMBODIMENTS

The following embodiments refer to the accompanying drawings for exemplifying specific implementable embodiments of the present disclosure. The foregoing preferred embodiments of the present disclosure are illustrative rather than limiting of the present disclosure. It is intended that they cover various modifications and similar arrangements be included within the spirit and scope of the present disclosure.

Figure 1:
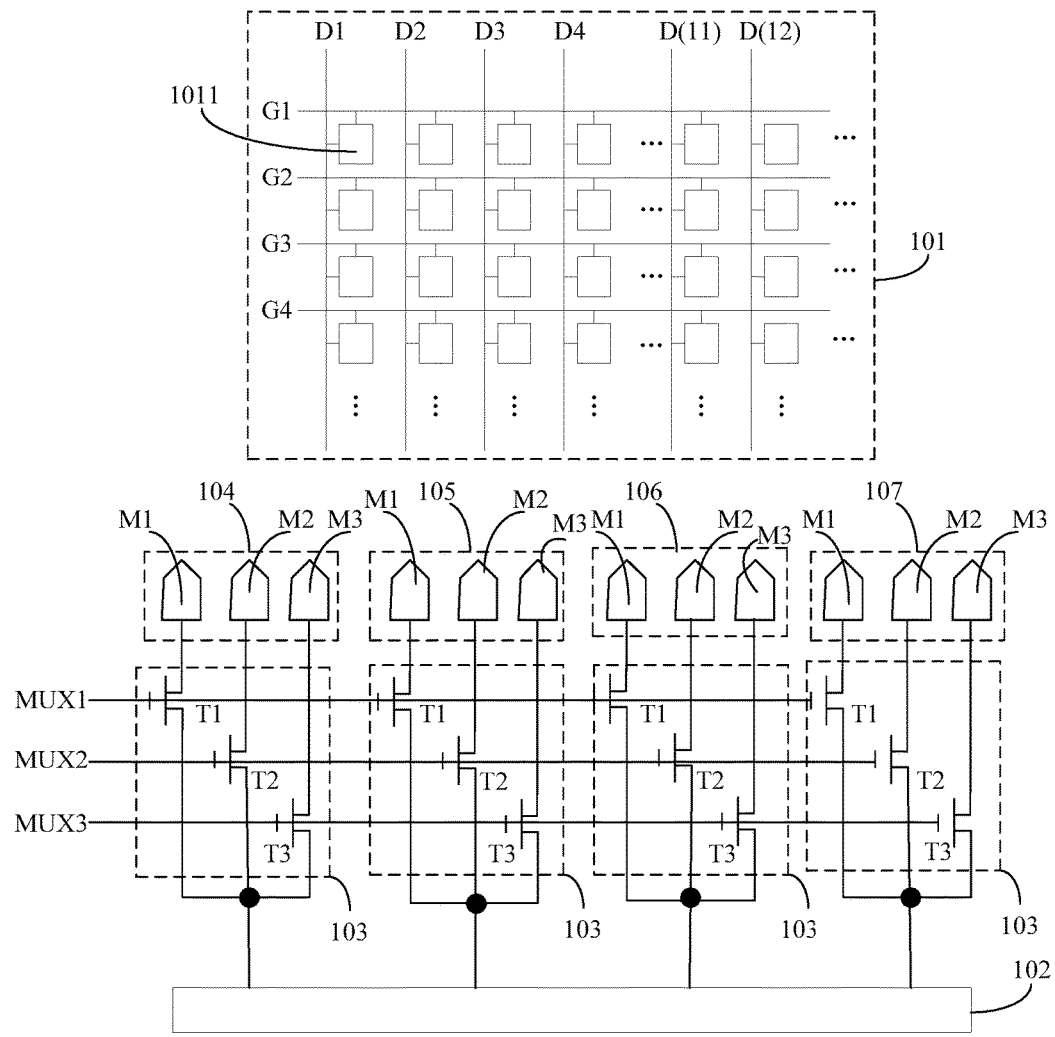
FIG. 1 is an illustrative structure diagram of a liquid crystal panel driving circuit according to one embodiment of the present disclosure.

FIG. 1 is an illustrative structure diagram of a liquid crystal panel driving circuit according to one embodiment of the present disclosure. In FIG. 1, the liquid crystal panel driving circuit includes an array substrate 101 arranged by a plurality of sub-pixel units 1011, a data driver 102, a switch unit 103, and a plurality of data lines D1-D12 (e.g., twelve data lines) and scan lines G1-G4 (e.g., four scan lines) formed between a plurality of columns and rows of the sub-pixel units 1011.

Each of the sub-pixel unit columns is coupled to one scan line, and each of the sub-pixel unit rows is coupled to one data line. Every three sub-pixel unit columns are defined as a row cycle that includes a first data line M1, a second data line M2, and a third data line M3 coupled to a same data driving signal output line of the data driver 102 via the switch unit 103.

The switch unit 103 includes a first control switch T1, a second control switch T2 and a third control switch T3. The first terminals of the first control switch T1, the second control switch T2 and the third control switch T3 are coupled to the same data driving signal output line of the data driver 102. A second terminal of the first control switch T1 is coupled to the first data line M1, a second terminal of the second control switch T2 is coupled to the second data line M2, and a second terminal of the third control switch T3 is coupled to the third data line M3. A control terminal of the first control switch T1 is configured to receive a first control signal MUX1, a control terminal of the second control switch T2 is configured to receive a second control signal MUX2, and a control terminal of the third control switch T3 is configured to receive a third control signal MUX3.

In one embodiment, the first control switch T1, the second control switch T2 and the third control switch T3 are a thin film transistor. The first terminal, the second terminal and the control terminal of the first control switch T1, the second control switch T2 and the third control switch T3 are a source electrode, a drain electrode and a gate electrode.

In detail, in a first row cycle 104, the first data line M1 is a first data wire D1 on the array substrate 101, the second data line M2 is a sixth data wire D6 on the array substrate 101, and the third data line M3 is a third data wire D3 on the array substrate 101. In a second row cycle 105, the first data line M1 is a fourth data wire D4 on the array substrate 101, the second data line M2 is a fifth data wire D5 on the array substrate 101, and the third data line M3 is a second data wire D2 on the array substrate 101. In a third row cycle 106, the first data line M1 is a eleventh data wire D11 on the array substrate 101, the second data line M2 is a eighth data wire D8 on the array substrate 101, and the third data line M3 is a ninth data wire D9 on the array substrate 101. In a fourth row cycle 107, the first data line M1 is a tenth data wire D10 on the array substrate 101, the second data line M2 is a seventh data wire D7 on the array substrate 101, and the third data line M3 is a twelfth data wire D12 on the array substrate 101. Persons skilled in the art can obtain a connection relationship of a whole liquid crystal panel according to the above connection relation.

For example, in the first row cycle 104, the first data line M1, the second data line M2 and the third data line M3 of the liquid crystal panel driving circuit in the present disclosure are connected to the same data driving signal output line of the data driver 102 via the first control switch T1, the second control switch T2 and the third control switch T3.

Since a data line of a earlier data signal output may be affected by a data line of a later data signal output, the switch unit 103 in the present disclosure is configured to control the first data line M1, the second data line M2, and the third data line M3 to output data signals in different output orders, such that a plurality of different data lines includes the same output order to improve the vertical lines on the liquid crystal display device and upgrade the display quality of the liquid crystal display device.

In one embodiment, the output orders of the data signals output by the first data line M1, the second data line M2, and the third data line M3 includes that the data signals are sequentially output by a first output order of the first data line, the second data line and the third data line, the data signals are sequentially output by a second output order of the third data line, the first data line and the second data line, and the data signals are sequentially output by a third output order of the second data line, the third data line and the first data line.

In one embodiment, the output orders of the data signals output by the first data line, the second data line and the third data line are switched once at a time period (i.e., a preset time period). The data signals are output according to the first output order during a $(3n+1)$th time period, the data signals are output according to the second output order during a $(3n+2)$th time period, and the data signals are output according to the third output order during a $(3n+3)$th time period, where n is an integer greater than zero.

Figure 2:
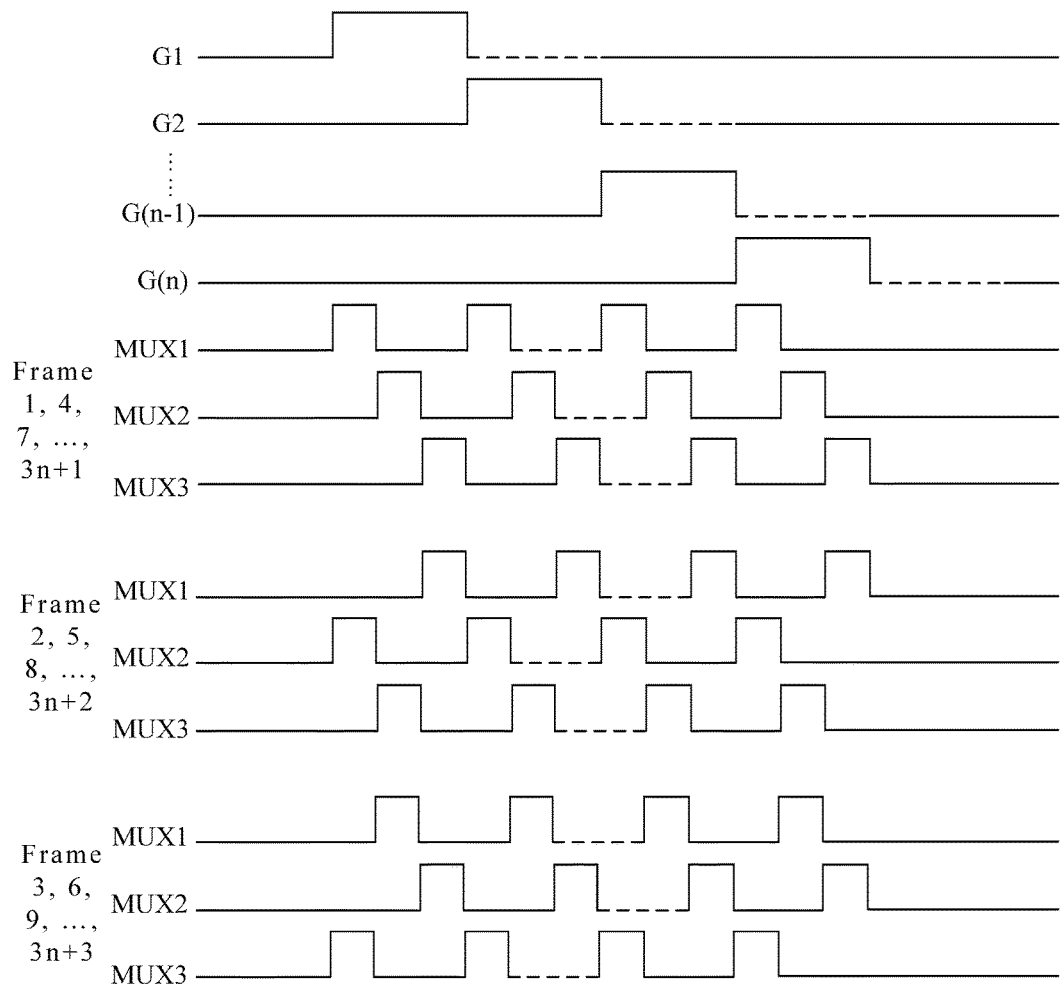
FIG. 2 is an illustrative first timing diagram of a liquid crystal panel driving circuit according to one embodiment of the present disclosure.

FIG. 2 is an illustrative first timing diagram of a liquid crystal panel driving circuit according to one embodiment of the present disclosure. As shown in FIG. 2, the time period is defined as one frame of display time. The scan lines are driven from the first line to the last line by controlling the first control signal MUX1, the second control signal MUX2 and the third control signal MUX3. In a first frame, a fourth frame, a seventh frame, . . . , and a $(3n+1)$th frame, the data signals are sequentially output by a first output order of the first data line, the second data line and the third data line. In a second frame, a fifth frame, a eighth frame, . . . , and a $(3n+2)$th frame, the data signals are sequentially output by a second output order of the third data line, the first data line and the second data line. In a third frame, a sixth frame, a ninth frame, . . . , and a $(3n+3)$th frame, the data signals are sequentially output by a third output order of the second data line, the third data line and the first data line.

Figure 3:
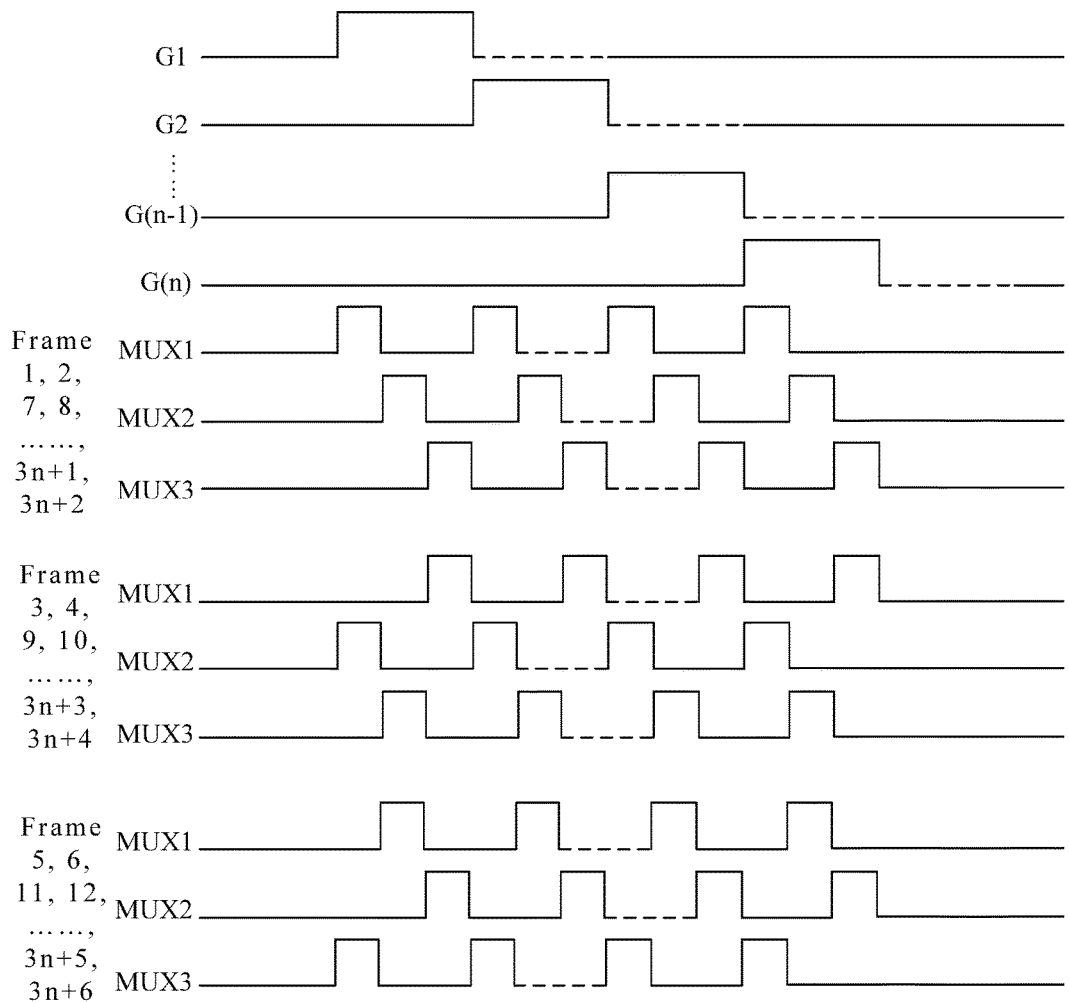
FIG. 3 is an illustrative second timing diagram of a liquid crystal panel driving circuit according to one embodiment of the present disclosure.

FIG. 3 is an illustrative second timing diagram of a liquid crystal panel driving circuit according to one embodiment of the present disclosure. As shown in FIG. 3, the time period is defined as two frames of display time. The scan lines are driven from the first line to the last line by controlling the first control signal MUX1, the second control signal MUX2 and the third control signal MUX3. In a first frame, a second frame, a seventh frame, a eighth frame, . . . , a $(3n+1)$th frame and a $(3n+2)$th frame, the data signals are sequentially output by a first output order of the first data line, the second data line and the third data line. In a third frame, a fourth frame, a ninth frame, a tenth frame, . . . , a $(3n+3)$th frame and a $(3n+4)$th frame, the data signals are sequentially output by a second output order of the third data line, the first data line and the second data line. In a fifth frame, a sixth frame, a eleventh frame, a twelfth frame, . . . , a $(3n+5)$th frame and a $(3n+6)$th frame, the data signals are sequentially output by a third output order of the second data line, the third data line and the first data line.

In one embodiment, the polarities of sub-units 1011 in a first frame, a third frame, . . . , and a $(2n+1)$th frame display time are inverse to the polarities of sub-units 1011 in a second frame, a fourth frame, . . . , and a (2n+2)th frame display time so that display driving operations are more balanced to improve a display quality.

Figure 4:
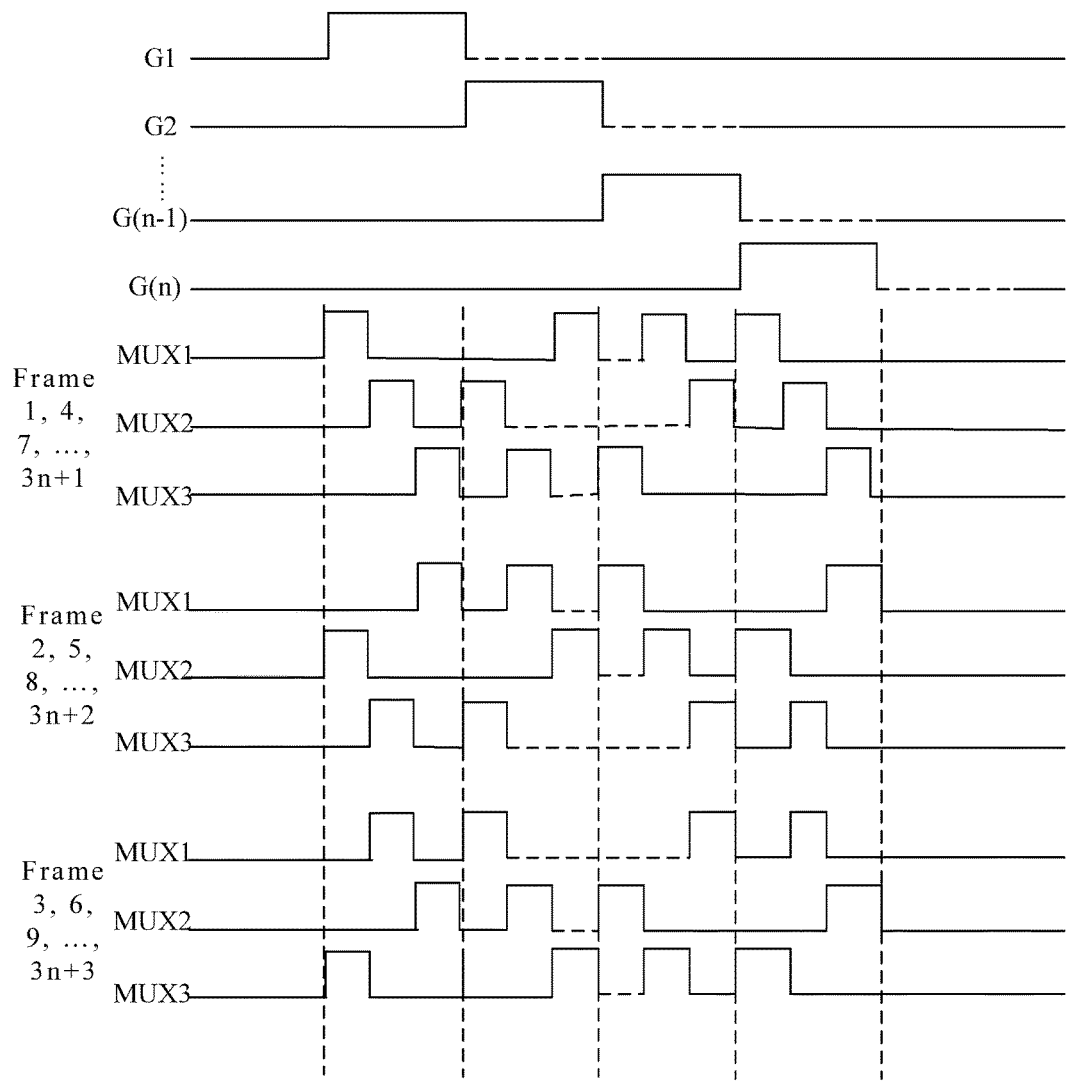
FIG. 4 is an illustrative third timing diagram of a liquid crystal panel driving circuit according to one embodiment of the present disclosure.

FIG. 4 is an illustrative third timing diagram of a liquid crystal panel driving circuit according to one embodiment of the present disclosure. As shown in FIG. 4, the time period is defined as one-tenth frame of display time. The scan lines are driven from the first line to the last line by controlling the first control signal MUX1, the second control signal MUX2 and the third control signal MUX3. In a first frame, a fourth frame, a seventh frame, . . . , and a (3n+1)th frame, the data signals are sequentially output by a first output order of the first data line, the second data line and the third data line. In a second frame, a fifth frame, a eighth frame, . . . , and a (3n+2)th frame, the data signals are sequentially output by a second output order of the third data line, the first data line and the second data line. In a third frame, a sixth frame, a ninth frame, . . . , and a (3n+3)th frame, the data signals are sequentially output by a third output order of the second data line, the third data line and the first data line.

In at least one embodiment, the present disclosure provides a liquid crystal panel driving circuit and a liquid crystal display device by changing the output orders of the data signals of the first data line, the second data line, and the third data line, such that the superposition of the data signals of the first data line, the second data line, and the third data line using a plurality of time periods to improve the vertical lines on the liquid crystal display device and upgrade the display quality of the liquid crystal display device.

The present disclosure further provides a liquid crystal display device including the above liquid crystal panel driving circuit, which will not be repeated here.

The present disclosure provides a liquid crystal panel driving circuit and a liquid crystal display device by changing the output orders of the data signals of the first data line, the second data line, and the third data line, such that the superposition of the data signals of the first data line, the second data line, and the third data line using a plurality of time periods to improve the vertical lines on the liquid crystal display device and upgrade the display quality of the liquid crystal display device.

As is understood by a person skilled in the art, the foregoing preferred embodiments of the present disclosure are illustrative rather than limiting of the present disclosure. It is intended that they cover various modifications and similar arrangements be included within the spirit and scope of the present disclosure, the scope of which should be accorded the broadest interpretation so as to encompass all such modifications and similar structures.

What is claimed is:

1. A liquid crystal panel driving circuit, comprising an array substrate arranged by a plurality of sub-pixel units, a data driver, a switch unit, and a plurality of data lines and scan lines formed between a plurality of sub-pixel unit columns and sub-pixel unit rows;
   wherein each of the sub-pixel unit columns is coupled to one scan line, each of the sub-pixel unit rows is coupled to one data line, every three sub-pixel unit columns are defined as a row cycle that comprises a first data line, a second data line, and a third data line coupled to a same data driving signal output line of the data driver via the switch unit;
   wherein the switch unit is configured to control the first data line, the second data line, and the third data line to output data signals in different output orders;
   wherein the switch unit comprises a first control switch, a second control switch and a third control switch;
   wherein first terminals of the first control switch, the second control switch and the third control switch are coupled to the same data driving signal output line of the data driver;
   wherein a second terminal of the first control switch is coupled to the first data line, a second terminal of the second control switch is coupled to the second data line, and a second terminal of the third control switch is coupled to the third data line;
   wherein a control terminal of the first control switch is configured to receive a first control signal, a control terminal of the second control switch is configured to receive a second control signal, and a control terminal of the third control switch is configured to receive a third control signal;
   wherein the output orders of the data signals which are output by the first data line, the second data line, and the third data line comprises:
      the data signals are sequentially output by a first output order of the first data line, the second data line and the third data line;
      the data signals are sequentially output by a second output order of the third data line, the first data line and the second data line; and
      the data signals are sequentially output by a third output order of the second data line, the third data line and the first data line.

2. The liquid crystal panel driving circuit of claim 1, wherein the first control switch, the second control switch and the third control switch are a thin film transistor, and the first terminal, the second terminal and the control terminal of the first control switch, the second control switch and the third control switch are a source electrode, a drain electrode and a gate electrode.

3. The liquid crystal panel driving circuit of claim 1, wherein the output orders of the data signals output by the first data line, the second data line and the third data line are switched once at a time period, wherein the data signals are output according to the first output order during a (3n+1)th time period, the data signals are output according to the second output order during a (3n+2)th time period, the data signals are output according to the third output order during a (3n+3)th time period, and wherein n is an integer greater than zero.

4. A liquid crystal panel driving circuit, comprising an array substrate arranged by a plurality of sub-pixel units, a data driver, a switch unit, and a plurality of data lines and scan lines formed between a plurality of sub-pixel unit columns and sub-pixel unit rows;
   wherein each of the sub-pixel unit columns is coupled to one scan line, each of the sub-pixel unit rows is coupled to one data line, every three sub-pixel unit columns are defined as a row cycle that comprises a first data line, a second data line, and a third data line coupled to a same data driving signal output line of the data driver via the switch unit;
   wherein the switch unit is configured to control the first data line, the second data line, and the third data line to output data signals in different output orders.

5. The liquid crystal panel driving circuit of claim 4, wherein the switch unit comprises a first control switch, a second control switch and a third control switch;
   wherein first terminals of the first control switch, the second control switch and the third control switch are coupled to the same data driving signal output line of the data driver;

wherein a second terminal of the first control switch is coupled to the first data line, a second terminal of the second control switch is coupled to the second data line, and a second terminal of the third control switch is coupled to the third data line; and wherein a control terminal of the first control switch is configured to receive a first control signal, a control terminal of the second control switch is configured to receive a second control signal, and a control terminal of the third control switch is configured to receive a third control signal.

6. The liquid crystal panel driving circuit of claim 5, wherein the first control switch, the second control switch and the third control switch are a thin film transistor, and the first terminal, the second terminal and the control terminal of the first control switch, the second control switch and the third control switch are a source electrode, a drain electrode and a gate electrode.

7. The liquid crystal panel driving circuit of claim 4, wherein the output orders of the data signals which are output by the first data line, the second data line, and the third data line comprises:
- the data signals are sequentially output by a first output order of the first data line, the second data line and the third data line;
- the data signals are sequentially output by a second output order of the third data line, the first data line and the second data line; and
- the data signals are sequentially output by a third output order of the second data line, the third data line and the first data line.

8. The liquid crystal panel driving circuit of claim 7, wherein the output orders of the data signals output by the first data line, the second data line and the third data line are switched once at a preset time period, wherein the data signals are output according to the first output order during a (3n+1)th time period, the data signals are output according to the second output order during a (3n+2)th time period, the data signals are output according to the third output order during a (3n+3)th time period, and wherein n is an integer greater than zero.

9. A liquid crystal display device comprising a liquid crystal panel driving circuit, wherein the liquid crystal panel driving circuit comprises an array substrate arranged by a plurality of sub-pixel units, a data driver, a switch unit, and a plurality of data lines and scan lines formed between a plurality of sub-pixel unit columns and sub-pixel unit rows;
- wherein each of the sub-pixel unit columns is coupled to one scan line, each of the sub-pixel unit rows is coupled to one data line, every three sub-pixel unit columns are defined as a row cycle that comprises a first data line, a second data line, and a third data line coupled to a same data driving signal output line of the data driver via the switch unit;

wherein the switch unit is configured to control the first data line, the second data line, and the third data line to output data signals in different output orders.

10. The liquid crystal display device of claim 9, wherein the switch unit comprises a first control switch, a second control switch and a third control switch;
- wherein first terminals of the first control switch, the second control switch and the third control switch are coupled to the same data driving signal output line of the data driver;
- wherein a second terminal of the first control switch is coupled to the first data line, a second terminal of the second control switch is coupled to the second data line, and a second terminal of the third control switch is coupled to the third data line; and
- wherein a control terminal of the first control switch is configured to receive a first control signal, a control terminal of the second control switch is configured to receive a second control signal, and a control terminal of the third control switch is configured to receive a third control signal.

11. The liquid crystal display device of claim 10, wherein the first control switch, the second control switch and the third control switch are a thin film transistor, and the first terminal, the second terminal and the control terminal of the first control switch, the second control switch and the third control switch are a source electrode, a drain electrode and a gate electrode.

12. The liquid crystal display device of claim 9, wherein the output orders of the data signals which are output by the first data line, the second data line, and the third data line comprises:
- the data signals are sequentially output by a first output order of the first data line, the second data line and the third data line;
- the data signals are sequentially output by a second output order of the third data line, the first data line and the second data line; and
- the data signals are sequentially output by a third output order of the second data line, the third data line and the first data line.

13. The liquid crystal display device of claim 12, wherein the output orders of the data signals output by the first data line, the second data line and the third data line are switched once at a preset time period, wherein the data signals are output according to the first output order during a (3n+1)th time period, the data signals are output according to the second output order during a (3n+2)th time period, the data signals are output according to the third output order during a (3n+3)th time period, and wherein n is an integer greater than zero.

* * * * *